United States Patent
Roca I Cabarrocas et al.

(10) Patent No.: US 10,763,381 B2
(45) Date of Patent: Sep. 1, 2020

(54) OPTO-ELECTRONIC DEVICE WITH TEXTURED SURFACE AND METHOD OF MANUFACTURING THEREOF

(71) Applicants: TOTAL S.A., Courbevoie (FR); ECOLE POLYTECHNIQUE, Palaiseau (FR); CENTRE NATIONAL DE LA RECHERCHE SCIENTIFIQUE, Paris (FR)

(72) Inventors: Pere Roca I Cabarrocas, Villebon sur Yvette (FR); Wanghua Chen, Bures-sur-Yvette (FR); Martin Foldyna, Antony (FR); Gilles Poulain, Palaiseau (FR)

(73) Assignees: TOTAL S.A., Courbevoie (FR); ECOLE POLYTECHNIQUE, Palaiseau (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 21 days.

(21) Appl. No.: 15/537,754

(22) PCT Filed: Dec. 21, 2015

(86) PCT No.: PCT/EP2015/080799
§ 371 (c)(1),
(2) Date: Jun. 19, 2017

(87) PCT Pub. No.: WO2016/102471
PCT Pub. Date: Jun. 30, 2016

(65) Prior Publication Data
US 2018/0006164 A1 Jan. 4, 2018

(30) Foreign Application Priority Data
Dec. 22, 2014 (EP) .................................. 14307132

(51) Int. Cl.
*H01L 31/0224* (2006.01)
*H01L 31/0236* (2006.01)
(Continued)

(52) U.S. Cl.
CPC .... *H01L 31/0236* (2013.01); *H01L 31/02168* (2013.01); *H01L 31/02327* (2013.01); *H01L 31/18* (2013.01); *Y02E 10/50* (2013.01)

(58) Field of Classification Search
CPC ................. H01L 31/0236; H01L 31/18; H01L 31/02168; H01L 31/02327; Y02E 10/50
See application file for complete search history.

(56) References Cited

U.S. PATENT DOCUMENTS

2008/0143906 A1* 6/2008 Allemand ........... H01L 31/0687
349/43
2009/0120492 A1* 5/2009 Sinha .................. H01L 31/0256
136/255
(Continued)

FOREIGN PATENT DOCUMENTS

AU    2013 207143 A1    7/2014
EP    2 275 842 A1      1/2011
(Continued)

OTHER PUBLICATIONS

International Search Report, dated Jun. 2, 2016, from corresponding PCT/EP2015/080799 application.
(Continued)

*Primary Examiner* — Steven H Loke
*Assistant Examiner* — Samuel Park
(74) *Attorney, Agent, or Firm* — Nixon & Vanderhye

(57) ABSTRACT

Disclosed is an opto-electronic device including a semiconducting substrate, a layered interface including at least one layer, the layered interface having a first surface in contact with a surface of the semiconducting substrate and the
(Continued)

layered interface being adapted for passivating the surface of the semiconducting substrate, the layered interface having a second surface and the layered interface being adapted for electrically insulating the first surface from the second surface, and a textured surface structure including a plurality of nanowires and a transparent dielectric coating, the textured surface structure being in contact with the second surface of the layered interface, the plurality of nanowires protruding from the second surface and the plurality of nanowires being embedded between the second surface and the transparent dielectric coating.

19 Claims, 2 Drawing Sheets

(51) Int. Cl.
    *H01L 31/0216*     (2014.01)
    *H01L 31/0232*     (2014.01)
    *H01L 31/18*     (2006.01)

(56) References Cited

U.S. PATENT DOCUMENTS

| | | | |
|---|---|---|---|
| 2009/0188557 A1* | 7/2009 | Wang | H01L 31/02168 136/256 |
| 2011/0097840 A1 | 4/2011 | Ramappa | |
| 2011/0308591 A1 | 12/2011 | Yamazaki et al. | |
| 2012/0132930 A1* | 5/2012 | Young | H01L 31/055 257/84 |
| 2012/0146194 A1 | 6/2012 | Roca I Cabarrocas et al. | |
| 2013/0291336 A1 | 11/2013 | Hoffmann et al. | |
| 2013/0291936 A1 | 11/2013 | Chen et al. | |
| 2014/0048131 A1* | 2/2014 | Tanaka | G06F 3/041 136/256 |
| 2015/0359105 A1* | 12/2015 | Yoon | C09D 139/02 174/268 |

FOREIGN PATENT DOCUMENTS

| | | |
|---|---|---|
| EP | 2 645 421 A1 | 10/2013 |
| GB | 2 508 642 A | 6/2014 |
| WO | 2012/057604 A1 | 5/2012 |
| WO | 2013/123066 A1 | 8/2013 |

OTHER PUBLICATIONS

Anastassios Mavrokefalos, et al., Efficient Light Trapping in Inverted Nanopyramid Thin Crystalline Silicon Membranes for Solar Cell Applications, Nano Letters, May 21, 2012, pp. 2792-2796, vol. 12, ACS Publications.

Erik Garnett, et al., Light Trapping in Silicon Nanowire Solar Cells, Nano Letters, Jan. 2010, pp. 1082-1087, vol. 10, ACS Publications.

Francesco Priolo, et al., Silicon nanostructures for photonics and photovoltaics, Nature Nanotechnology, Jan. 2014, pp. 19-32, vol. 9, Macmillan Publishers Limited.

Jihun Oh, et al., An 18.2%-efficient black-silicon solar cell achieved through control of carrier recombination in nanostructures, Nature Nanotechnology, Nov. 2012, pp. 743-748, vol. 7, Macmillan Publishers Limited.

Sangmoo Jeong, et al., All-back-contact ultra-thin silicon nanocone solar cells with 13.7% power conversion efficiency, Nature Communications, Dec. 16, 2013, pp. 1-7, Macmillan Publishers Limited.

* cited by examiner

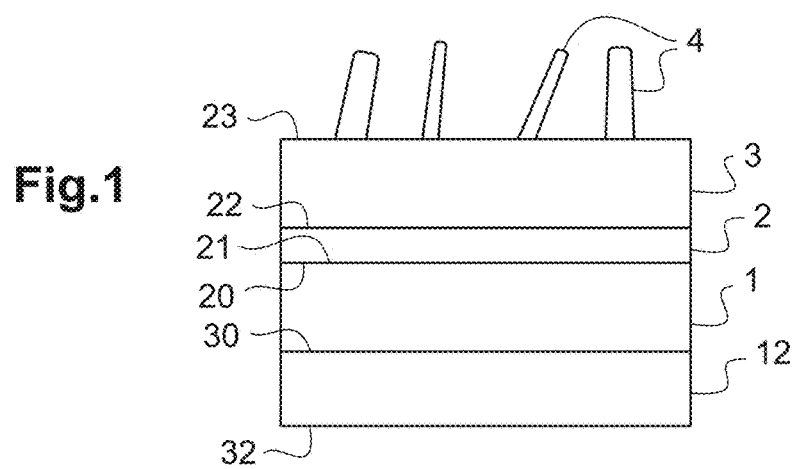
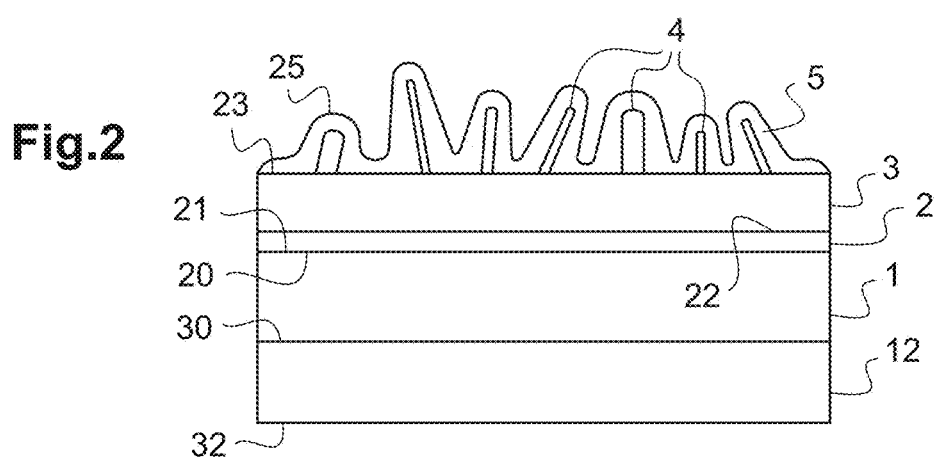
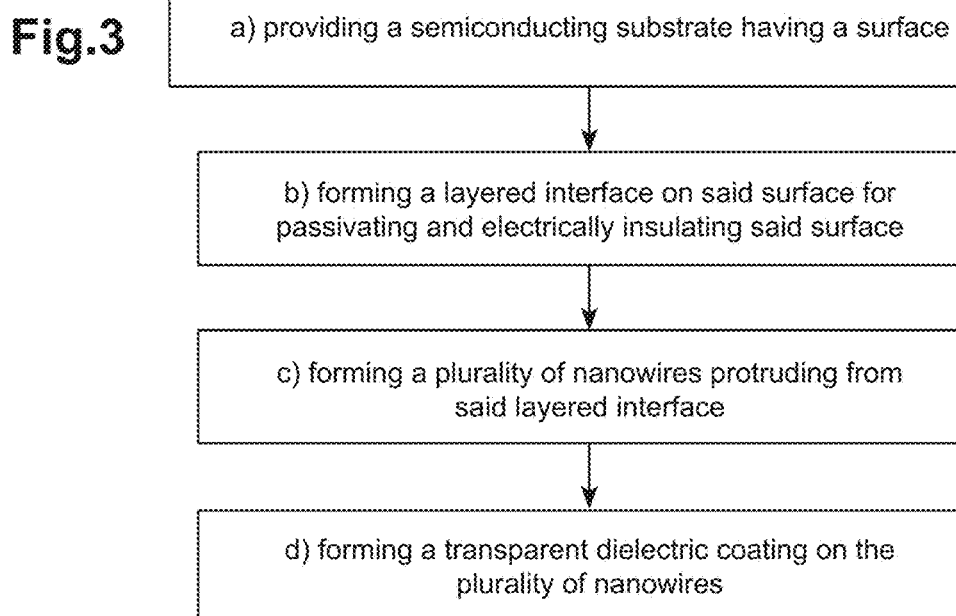

OPTO-ELECTRONIC DEVICE WITH TEXTURED SURFACE AND METHOD OF MANUFACTURING THEREOF

TECHNICAL FIELD

The present invention relates in general to the manufacturing and the structure of opto-electronic devices. In particular, the invention relates to the enhancement of conversion efficiency and to the reduction of optical losses in a photovoltaic solar cell. More specifically, the invention concerns photovoltaic solar cells with a textured surface.

BACKGROUND

Opto-electronic devices and in particular photovoltaic solar cells rely on the absorption of photons for generating electrical charge carriers. Most photovoltaic solar cells use semiconductor materials in the form of a p-n junction. The p-n junction enables collection of the charge carriers and generation of electrical power.

However, the conversion efficiency of photovoltaic solar cells is limited, at least for some part, by recombination losses due to recombination of charge carriers especially at the surfaces of the semiconductor material. Surface passivation is necessary to passivate the dangling bonds at the surface of a semiconductor material. A thin film is usually applied on the exposed surface for passivating the semiconducting material. Different materials can be used for surface passivation. For example, dielectric materials such as thermally grown silicon dioxide or silicon nitride are commonly used in the PV industry. Semiconducting materials having a wider bandgap than the bulk semiconductor can also be used. For example intrinsic amorphous hydrogenated silicon can be used for the passivation on crystalline silicon. The thickness of the passivating layer is generally comprised between one nanometer and a few tens of nanometers, so as to avoid light absorption by the passivating layer.

The conversion efficiency of photovoltaic (PV) solar cells may also be limited by optical losses due to reflections at the front and/or back surface of the PV cell.

In the present document, the front side of an opto-electronic device is the side which is exposed to the incoming light beam, such as sun light in a solar cell, or an incident light beam to be detected on a photodiode detector. The back side of an opto-electronic device is opposite to the front side.

Anti-reflection coating, or ARC, is commonly used to reduce reflection of incoming light on the front surface (see US 2011/0097840). The ARC may consist in a single thin dielectric layer or in a multilayer stack. The thickness and refractive index of each layer of an ARC are selected so as to create destructive interferences between the light beams reflected on each surface or interface in order to reduce the overall reflected beam intensity. For example, a double layer anti-reflection coating comprising a layer of zinc sulfide (ZnS) and a layer of magnesium fluoride (MgF) can be used. Alternatively, two layers of silicon nitride with varying refractive indices can also be used as anti-reflection coating.

Surface texturing can also be used to reduce light reflection especially on the front surface. Moreover, texturing the surface of a thin solar cell enables multiple passes of the light inside the thin solar cell by total internal reflection. Surface texturing thus also enhances light trapping inside the solar cell. Light trapping increases the optical path length of incoming photons inside the solar cell. Because absorption of near infrared photons in silicon requires optical path lengths larger than the cell thickness particularly for thin devices, surface texturing, by increasing light trapping inside the solar cell, thus increases light absorption and generation of charge carriers.

In the past, various techniques have been employed for surface texturing. These texturing techniques may be classified in wet etching and dry etching processes. In particular, the anisotropic wet-etching of a monocrystalline silicon substrate preferentially etches along some crystallographic orientations. The etching of silicon thus may result in a textured surface made up of randomly distributed pyramids, wherein the tops of the pyramids protrude out of the substrate. Other texturing processes, such as plasma etching, may produce other types of surface texturing, such as inverted-type pyramids, wherein the tops of the pyramids are oriented toward the bulk of the silicon substrate (see P. Roca i Cabarrocas et al., "Method of texturing the surface of a silicon substrate, and textured silicon substrate for a solar cell", US2012/0146194 and see A. Mavrokefalos et al., "Efficient light trapping in inverted nanopyramid thin crystalline silicon membranes for solar cell applications", Nano Lett., 2012, 12, 2792-2796) or silicon nanowires or silicon nanocones (see Sangmoo Jeong et al. "All-back-contact ultra-thin silicon nanocone solar cell with 13.7% power conversion efficiency", Nature Comm., 2013, DOI: 10.1038/ncomms3950).

Moreover, masking techniques may also be employed, in combination with either wet or dry etching, to produce periodic surface texturing. Nanostructuring by nanoimprint with dry or wet etching enables forming photonic structures or periodic inverted pyramids at the surface of a solar cell.

The surface passivation of a textured surface, for example pyramid-shaped surface, is more complex than that of a flat surface, due to the higher developed surface and to the presence of inhomogeneities.

The structure of a solar cell generally relies on a planar junction of homojunction or heterojunction type. Screen printed solar cells and buried contact solar cells provide a metal grid contacts on the front surface and back contacts. In such devices, the p-n junction is formed across the device thickness. In contrast, rear contact or Interdigitated Back Contact (IBC) solar cells place both electrodes on the back surface, thus eliminating shadowing losses on the front side. In IBC structures, the p-n junction is formed near the backside of the solar cell. Other types of junctions have also been proposed such as radial junction silicon nanowires, wherein each silicon nanowire has a radial doping profile thus forming a radial p-n junction.

Solar cell devices having textured surfaces thus generally present higher recombination losses than solar cells with a flat surface. These recombination losses are generally attributed to textured surface inhomogeneities and/or imperfect passivation. It has been shown that ordered arrays of silicon nanowires forming radial p-n junctions increase the path length of incident solar radiation by up to a factor of 73, but that there is a competition between advantages in light-trapping, providing improved absorption and disadvantages in surface recombination (see Erik Garnett and Peidong Yang "Light trapping in silicon nanowire solar cell", Nano Lett., 2010, 10, 1081-1087 or F. Priolo et al. "Silicon nanostructures for photonics and photovoltaics", Nature Comm., January 2014, DOI: 10.1038/NNANO.2013.271).

Other surface modifications have been proposed to increase light absorption in a solar cell without increasing recombination generally associated with nanostructures. In particular, the formation of needle-shaped structures on a silicon substrate produces a so-called black-silicon surface which provides high absorption of incoming light (see Jinhun Oh, Hao-Chih Yuan and Howard M. Branz "An 18.2%-efficient black-silicon solar cell achieved through control of carrier recombination in nanostructures", Nature nanotechnology, vol. 7, 2012, pp. 743-748). Auger recombination can be suppressed with light and shallow doping and simultaneous control of the surface area. However, the passivation of a needle-shaped structured surface is difficult. Thus, surface recombination remains an issue in nanostructured silicon solar cells.

Document US 2013/0291336 A1 discloses forming an array of nanorods of zinc oxide or magnesium zinc oxide on a front side surface of a solar cell, a protective layer being formed on the nanorods, these nanorods having a high aspect ratio and a length of a few micrometers. According to US 2013/0291336 A1, the array of nanorods contributes to a low reflectance in a wide range of sunlight wavelength and a wide range of incident angles, thus enabling an increased absorption of sunlight, and in turn a higher solar cell efficiency as compared to a solar cell with a conventional ARC layer.

Technical Problem

Therefore, a need has arisen for opto-electronic devices, such as solar cells, providing enhanced light trapping without increasing surface recombination of charge carriers.

In particular, there is a need to further improve solar cell efficiency, and to further increase absorption of incoming light in a solar cell, without increasing surface recombination of charge carriers.

SUMMARY OF THE INVENTION

In accordance with the disclosed subject-matter, opto-electronic devices and solar cell structures and method of manufacturing are provided.

More precisely, the present invention thus provides an opto-electronic device comprising a semiconducting substrate having a surface.

According to the present invention, said opto-electronic device comprises a layered interface comprising at least one layer, said layered interface having a first surface in contact with said surface of said semiconducting substrate and said layered interface being adapted for passivating said surface of said semiconducting substrate, said layered interface having a second surface and said layered interface being adapted for electrically insulating said first surface from said second surface, and a textured surface structure comprising a plurality of nanowires and a transparent dielectric coating, said textured surface structure being in contact with said second surface of said layered interface, said plurality of nanowires protruding from said second surface and said plurality of nanowires being embedded between said second surface and said transparent dielectric coating.

This opto-electronic device provides enhanced light trapping without increasing surface recombination of the charge carriers. More precisely, light trapping is enhanced by scattering of the incoming light on the textured surface structure whereas the surface recombination is not increased due to the layered interface which provides electrical insulation between the substrate and the nanowires of the textured surface structure. The nanowires and the transparent dielectric coating form a textured surface structure. Optical absorption by this textured surface structure is reduced due to the transparent dielectric coating covering the nanowires. Moreover, optical reflectivity of the textured surface structure is also reduced due to the combination of this transparent dielectric coating, the layered interface and the nanowires. Thus, light absorption in the semiconducting substrate is increased.

According to a first embodiment of the invention, said layered interface comprises a passivating layer and a transparent dielectric layer, said first surface of said layered interface being a surface of said passivating layer, and said second surface of said layered interface being a surface of said transparent dielectric layer, said passivating layer being in contact with another surface of said transparent dielectric layer, and said transparent dielectric layer being separated from said surface of said semiconducting substrate.

According to a particular aspect of this first embodiment, said passivating layer comprises a layer of amorphous hydrogenated silicon and said transparent dielectric layer comprises a layer of silicon nitride, silicon oxide or aluminum oxide.

According to another embodiment of the invention, said layered interface comprises a single passivating and electrically insulating layer.

According to a particular aspect of this embodiment, said single passivating and electrically insulating layer comprises a layer of silicon nitride, silicon oxide or aluminum oxide.

According to another particular aspect of the invention, said at least one layer of said layered interface and said transparent dielectric coating have respective thicknesses and refractive indices chosen so that said layered interface, said plurality of nanowires and said transparent dielectric coating collectively form an anti-reflection coating.

According to a particular aspect of the invention, said passivating layer, said transparent dielectric layer, said single passivating and electrically insulating layer and/or said transparent dielectric coating have thicknesses comprised between 2 nanometers and 300 nanometers, preferably between 10 nanometers and 200 nanometers.

According to a particular embodiment of the invention, said surface of said semiconducting substrate is flat over an area of at least micrometric dimensions.

According to another particular embodiment of the invention, said surface of said semiconducting substrate comprises a microstructurally textured surface.

According to a particular aspect of the invention, said plurality of nanowires has a random or periodic spatial distribution on said dielectric layer.

According to a particular aspect of the invention, said substrate comprises a monocrystalline silicon substrate or microcrystalline silicon substrate or polycrystalline silicon substrate.

Preferably, said plurality of nanowires comprises a plurality of silicon or zinc-oxide nanowires.

According to a particular aspect of the invention, said nanowires coated by said dielectric coating have a height comprised between 20 nanometers and 200 nanometers, a diameter comprised between 20 nanometers and 50 nanometers, a density comprised between $10^7$ cm$^{-2}$ and $10^9$ cm$^{-2}$ and/or an aspect ratio comprised between 1 and 100.

In particular, such an optoelectronic device may comprise a solar cell, a photodiode or a light detector.

The invention also concerns a method of fabricating an optoelectronic device comprising the steps of:
a) Providing a semiconducting substrate having a surface;
b) Forming a layered interface comprising at least one layer on said substrate surface, said layered interface having a first surface in contact with said surface of said semiconducting substrate and said layered interface being adapted for passivating said surface of said semiconducting substrate, said layered interface having a second surface and said layered interface being adapted for electrically insulating said first surface from said second surface;

c) Forming a plurality of nanowires protruding from said second surface of said layered interface; and d) Forming a transparent dielectric coating on the plurality of nanowires, so that said plurality of nanowires is embedded between said second surface of said layered interface and said transparent dielectric coating.

This method enables to manufacture optoelectronic devices, such as solar cells, having increased light trapping, and light absorption properties without increasing surface recombination of the charge carriers.

This method can be easily implemented into a conventional solar cell manufacturing method, as it requires only few additional steps.

The method of the invention can be realized in a low temperature plasma reactor, at temperatures below 500° C., and preferably below 450° C.

According to a particular aspect of the method of the invention, the step c) of forming a plurality of nanowires on said dielectric layer comprises the following steps:

e) Evaporating a thin layer of a metal catalyst on said second surface of said layered interface;

f) Exposing the thin layer of metal catalyst to a hydrogen plasma for forming metal catalyst droplets;

g) Growing nanowires from the metal catalyst droplets using a vapor-liquid-solid process;

h) Removing the metal catalyst droplets.

According to a particular aspect, said step b) comprises:

b1) Forming a passivating layer on said surface of the semiconducting substrate for passivating said semiconductor substrate surface; and b2) forming a transparent dielectric layer on said passivating layer, said transparent dielectric layer being in contact with said passivating layer and said transparent dielectric layer being separated from said surface of said semiconducting substrate.

BRIEF DESCRIPTION OF THE DRAWINGS

This description is given for non limiting illustrative purposes only and will be better understood when referring to the annexed drawings wherein:

FIG. 1 represents in cross-section a solar cell structure at an intermediate manufacturing step, before deposition of the dielectric capping layer;

FIG. 2 represents in cross-section a solar cell structure according to a first embodiment of the invention;

FIG. 3 represents schematically a method of manufacturing a solar cell according to the invention;

DETAILED DESCRIPTION

Device

Figure 4:
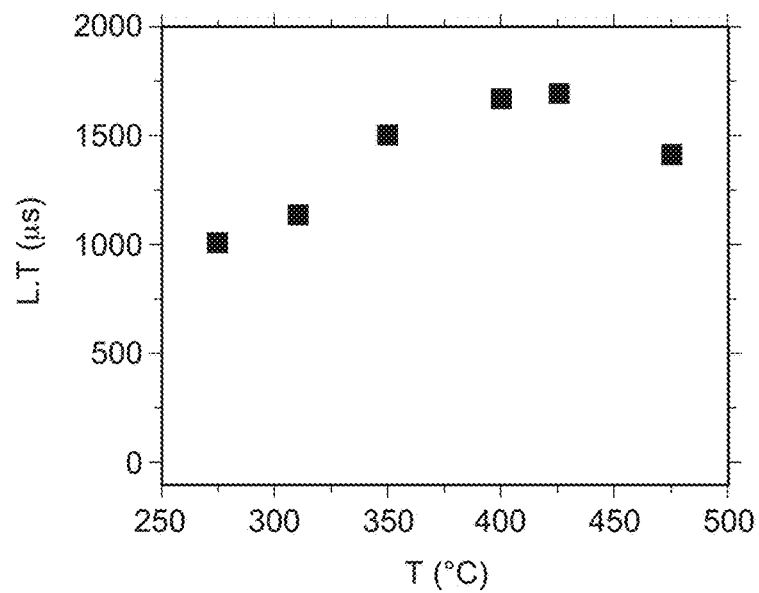
FIG. 4 represents measurements of effective carrier lifetime as a function of silicon nanowires growth temperature.

FIG. 1 represents schematically in cross-section a solar cell structure according to a first embodiment of the invention, at an intermediate manufacturing step, before deposition of the transparent dielectric coating for capping the nanowires.

The solar cell comprises a semiconducting substrate 1 having a front surface 20 and a back surface 30. The front surface 20 is exposed to incoming sunlight and the back surface 30 is generally parallel to the front surface. The semiconducting substrate 1 includes a homojunction or heterojunction device (not represented herein).

For example, the semiconducting substrate 1 is selected from a monocrystalline silicon (c-Si) substrate or from other semiconducting materials such as microcrystalline silicon (μc-Si), polycrystalline silicon, copper indium gallium selenide (CIGS) and cadmium telluride (CdTe). Preferably, the semiconducting substrate 1 comprises a monocrystalline silicon substrate or microcrystalline silicon or polycrystalline silicon. As an example, the semiconducting substrate 1 consists in a double-side polished silicon wafer.

The solar cell comprises a layered interface on the front side surface 20 of the semiconducting substrate and a textured surface structure on this layered interface.

As used herein, the term "a layer on a surface" means that this layer is in contact with this surface, regardless of the deposition or growth process for forming said layer.

The layered interface has a first surface 21 and a second surface 23. The first surface 21 of the layered interface is in contact with the front side surface 20. The layered interface is selected so that this layered interface passivated the front side surface 20 of the semiconducting substrate 1. Moreover, this layered interface is configured so that the first surface 21 is electrically insulated from the second surface 23.

In a first embodiment, illustrated on FIGS. 1 and 2, the layered interface comprises a passivating layer 2 and a transparent dielectric layer 3.

In the exemplary view of FIG. 1, the solar cell comprises a passivation layer 2 on a surface 20 of the semiconducting substrate 1. The passivation layer 2 may be a semiconducting layer, such as hydrogenated amorphous silicon (a-Si:H). Alternatively, the passivation layer 2 may be a dielectric layer of hydrogenated amorphous silicon oxide (a-SiO$_x$:H), aluminum oxide (AlO$_x$), silicon carbide, or silicon dioxide.

The thickness of this passivation layer 2 is generally comprised between 2 nanometers and 20 nanometers.

Preferably, the passivation layer 2 comprises a layer of hydrogenated amorphous silicon (a-Si:H) having a thickness of about 4 nanometers.

In this embodiment, the first surface 21 of the layered interface is a surface of the passivation layer 2 which is on the surface 20 of the semiconducting substrate.

The passivation layer 2 enables to neutralize chemically and physically the unsaturated dangling bonds at the crystalline silicon surface 20. Moreover, the passivation layer 2 enables to reduce charge carrier neutralization or recombination occurring at the surface of the semiconducting substrate.

On FIG. 1, the solar cell comprises another passivation layer 12 on a back side surface 30 of the semiconducting substrate 1. This passivation layer 12 generally comprises a layer of the same material as the passivation layer 2 of the front surface, such as amorphous hydrogenated silicon (a-Si:H). The thickness of this passivation layer 12 is generally comprised between 2 nanometers and at least 30 nanometers, and preferably around 20 nanometers.

Similarly, the passivation layer 12 enables to neutralize chemically and physically the unsaturated dangling bonds at the crystalline silicon back surface 30.

The solar cell also comprises a transparent dielectric layer 3 on the passivation layer 2 of the front surface. The transparent dielectric layer 3 comprises for example a single layer of silicon nitride ($SiN_x$, a-$SiN_x$:H) or silicon dioxide ($SiO_2$) or aluminum oxide.

In this embodiment, the second surface 22 of the layered interface is a surface of the transparent dielectric layer 3, this surface 22 being separated from the passivating layer 2. The passivating layer 2 is in contact with another surface 22 of this transparent dielectric layer 3.

The transparent dielectric layer 3 is configured to provide electrical insulation between its surface 22 and its surface 23. As a result, the layered interface provides passivation of the surface 20 of the semiconducting substrate while providing electrical insulation between the surface 20 of the semiconducting substrate and the second surface 23 of this layered interface.

The solar cell further comprises a textured surface structure on the second surface 23 of the layered interface.

More precisely, this textured surface structure comprises nanowires 4. The nanowires are formed on the second surface 23 of the layered interface.

In the example of FIGS. 1 and 2, the nanowires 4 are on the surface 23 of the dielectric layer 3.

For example, the nanowires 4 are made of silicon, silicon oxide, zinc-oxide or nanowires grown at low temperature, preferably at temperatures below 500° C., for example using a Vapor-Liquid-Solid process. The length of the nanowires is generally comprised between 20 nanometers and 200 nanometers. The diameter of the nanowires is generally comprised between 2 nanometers and 50 nanometers.

Generally, the nanowires 4 protrude from the underlying layered interface second surface 23, one extremity of the nanowires 4 being in contact with the second surface 23, and at least another part of said nanowire being at a distance from this second surface 23 and protruding therefrom. Thus, an extremity of each nanowire 4 is in contact with the second surface 23 of the layered interface. In the example of FIGS. 1 and 2, the nanowires are in contact with the dielectric layer 3. However, the nanowires 4 are not in contact with the passivation layer 2. As a result, the nanowires 4 are electrically insulated from the passivation layer 2 and from the surface 20 of the semiconducting substrate 1. This configuration avoids introducing defects on the passivated surface of the semiconducting substrate 1.

The plurality of nanowires 4 may have a random distribution of orientations with respect to the second surface 23 of the layered interface.

In the example shown, the nanowires 4 are straight; however other shapes might be contemplated within the scope of the present disclosure. Preferably, the nanowires 4 have orientations in the range from the normal to the second surface 23 of the layered interface to an inclined orientation forming an angle up to more than 85 degrees with the normal to the second surface 23 of the layered interface. In an example, the nanowires 4 are vertically aligned, which means herein that the nanowires are parallel to the normal to the local surface.

The density of the nanowires is comprised between $10^7$ $cm^{-2}$ and $10^9$ $cm^{-2}$, for example of $10^8$ $cm^{-2}$.

The spatial distribution of the nanowires may be random. Alternatively, the spatial distribution of the nanowires is periodic, for example following a hexagonal pattern with center to center distance of 600 nm.

FIG. 2 represents an example structure of a solar cell device according to the first embodiment of the invention.

The solar cell comprises a layered interface and a textured surface structure on the second surface 23 of the layered interface.

The textured surface structure comprises nanowires 4 and a dielectric coating 5 on the nanowires 4. For example, the dielectric coating 5 includes a layer of silicon nitride ($SiN_x$) or a layer of silicon dioxide ($SiO_2$). The thickness of the dielectric coating 5 is comprised between 10 nanometers and 300 nanometers, and preferably between 20 nm and 50 nm. The dielectric coating 5 covers the nanowires 4 and generally also covers the surface of the dielectric layer 3 in-between said nanowires 4.

This dielectric coating 5 is chosen to be transparent so as to reduce possible optical losses due to absorption at the surface of the device.

As a result, the nanowires 4 are completely embedded between the second surface 23 of the layered interface and the dielectric coating 5. In other words, the nanowires 4 form a skeleton supporting the dielectric coating 5. Thus, dielectric coated nanowires are formed.

In the case of the first embodiment, the nanowires 4 are embedded between the dielectric layer of the layered interface and the dielectric coating 5.

The textured surface structure is in contact with the second surface 23 of the layered interface. The textured surface has another surface 25 which is a surface of the dielectric coating 5. This surface 25 is the front surface of the solar cell device.

The optoelectronic device is operated by receiving incident light on the side of the device which carries the dielectric coated nanowires. The incoming light is incident on the surface 25 of the textured surface structure. Thus, the incoming light is incident on the dielectric coated nanowires. The dielectric coated nanowires diffract incident light into the semiconducting substrate 1 and thus enhance light trapping inside the semiconducting substrate 1.

The structure of the optoelectronic device enables to separate on the one hand, the optical properties of the device, relating to surface reflectivity, and, on the other hand, the electrical properties of said device, relating to the passivation of the surface 20 of the semiconducting substrate 1.

More precisely, the textured surface structure provides a surface roughness which enables to decrease surface reflection without increasing light absorption on this surface of the device. The nanowires 4 form a structure for supporting the transparent dielectric coating 5. The transparent dielectric coating 5 enables to reduce the optical reflectivity of the textured surface structure including said nanowires. The dielectric coating 5 is preferably made of a material which is transparent over the considered spectral range. For example, in solar cell applications, the dielectric coating 5 is transparent over a spectral range extending at least from 350 nm to 1000 nm.

The dimensions of the dielectric coated nanowires are generally lower than the incoming light wavelength. This ensures that incoming light incident on the silicon nanowires 4 is diffracted. As an example silicon nitride coated nanowires have an average length of 105 nm, with diameters of 425 nm. The aspect ratio of the dielectric coated nanowires is herein defined as the ratio between the height to the diameter of these dielectric coated nanowires. In the above example, the dielectric coated nanowires aspect ratio is equal to 105/425=0.247. Preferably, the aspect ratio of the dielectric coated nanowires is comprised between 0.5 and 100.

The dielectric coated nanowires thus enable to reduce the surface reflection coefficient, while providing a low absorption and while diffracting the incoming light into the semiconducting substrate.

As a result, this textured surface structure provides surface texturing which enhances light trapping inside the optoelectronic device, for example inside a solar cell.

The nanowires can be formed at low temperature, in general less than 500° C., thus preserving the electronic properties of the electronic junction in the semiconducting substrate.

The thickness of the dielectric layer 3 is generally comprised between 1 nanometer and 100 nanometers. For example, the dielectric layer 3 is a layer of silicon dioxide ($SiO_2$) having a thickness of 100 nanometers.

The dielectric layer 3 between the nanowires 4 and the semiconducting substrate 1 provides electrical insulation between the nanowires and the semiconducting substrate 1, or between the nanowires 4 and the passivation layer 2. Moreover, the dielectric layer 3 separates physically the passivated surface of the semiconducting substrate from the roughness provided by the nanowires 4.

The passivating layer 2 enables a close to perfect surface passivation of the surface of the semiconducting substrate 1, especially for a semiconducting substrate having a flat surface. Being ultrathin (in general less than 20 nm), the passivating layer 2 induces almost no light absorption, so that light passing through said passivating layer 2 reaches the semiconducting substrate 1. The incoming light then generates charge carriers inside the electronic junction of the semiconducting substrate.

Preferably, the thicknesses and the refractive indices of the dielectric layer 3, of the dielectric coating 5, and/or of the passivation layer 2 are selected so as to form an antireflective stack in the desired wavelength range of the incoming light beam. Thus, the dielectric layers 3, 5 and/or the passivation layer 2 form an anti-reflection coating (ARC).

Moreover, surprisingly, the solar cell structure disclosed herein enhances front surface passivation.

The solar cell with a textured surface structure on a layered interface enables both increased light trapping and lower surface recombination. The layered interface provides both surface passivation of the semiconducting substrate and electrical insulation from this semiconducting substrate. This structure enables decoupling the optical properties of the surface from the electrical passivation of the semiconducting substrate.

In a variant, the dielectric layer 3 may present a gradient profile as a function of this layer thickness. In this variant, this dielectric layer 3 still has a second surface 23 which is electrically insulated from the first surface 21 of the layered interface. The textured surface structure including the nanowires remains on the second surface 23 of this dielectric layer 3.

In another variant, the layered interface comprises other transparent layers on a first dielectric layer 3. For example, the layered interface comprises a multilayer stack of dielectric layers on a passivating layer 2. However, the layered interface still presents a first surface 21 and second surface 23. In this case, the second surface 32 is the top surface of multilayer stack. As in the first embodiment detailed above, the first surface 21 is in contact with the surface 20 of the semiconducting substrate 1, this layered interface passivating the surface 20 of the semiconducting substrate 1 and the second surface 23 is electrically insulated from the first surface 21. The textured surface structure including the nanowires is also on this second surface 23 of this layered interface.

In another embodiment (not illustrated herein), the layered interface comprises a single interface layer instead of a dielectric layer 3 on a passivation layer 2. In this case, the layered interface still presents a first surface 21 and a second surface 23, which are both surfaces of the same interface layer. This interface layer is on the semiconducting substrate surface 20, and the textured surface structure including the nanowires is on the second surface 23 of this interface layer. In this case, this interface layer is made of a dielectric material which provides electrical insulation between the first surface 21 and the second surface 23, and which also has passivating properties, for passivating the surface 20 of the semiconducting substrate 1. As an example, a single interface layer may be made of silicon oxide. The thickness of the interface layer is generally comprised between 1 nanometer and 100 nanometers. For example, the dielectric interface layer is a layer of silicon dioxide ($SiO_2$) having a thickness of 100 nanometers.

In this embodiment, the single interface layer provides simultaneously surface passivation to the semiconducting substrate and electrical insulation between the semiconducting substrate and the nanowires 4.

The optoelectronic device further comprises nanowires 4 deposited or grown on this single interface layer, and a transparent dielectric coating 5 covering said nanowires.

As in the first embodiment, the nanowires 4 provide a textured surface supporting the transparent dielectric coating 5. This dielectric coating 5 enables to reduce surface reflectivity. The coated nanowires diffract incident light into the substrate without inducing absorption losses at this textured surface.

Preferably, the thicknesses and the refractive indices of this single interface layer 3 and of the dielectric coating 5 are selected so as to form an antireflective stack in the desired wavelength range of the incoming light beam. Thus, the dielectric layers 3 and 5 form an anti-reflection coating.

In a variant of this embodiment, the interface layer forming the layered interface may present a gradient profile as a function of this layer thickness.

The solar cell with a textured surface structure on a layered interface providing both electrical insulation and surface passivation of the semiconducting substrate, provides both high light trapping and low surface recombination. This architecture of a solar cell also enables decoupling the optical properties of the surface from the electrical passivation of the semiconducting substrate.

In summary, the solar cell comprises at least one interface layer for passivating the semiconductor substrate surface by forming a passivated surface and for electrically insulating said passivated surface from a surface textured with dielectric coated nanowires.

Thus, the devices disclosed herein provide simultaneously a rough surface texture, due to the nanowires, and a passivated surface to the semiconducting substrate. This architecture enables to reduce the optical reflectivity of the surface exposed to the incoming light while limiting optical absorption in the rough surface textured with nanowires. Simultaneously, this architecture enables to increase light absorption into the semiconducting substrate without increasing recombination of charge carriers at the surface of the semiconducting substrate.

The devices disclosed herein are particularly well adapted to IBC type solar cells, wherein the electrical contacts are located on the back side of the substrate.

In the examples detailed above, the substrate surface 20 whereon the layered interface and the textured surface structure are lying is a flat surface.

Alternatively, the substrate front surface 20 may comprise microstructures, these microstructures comprising flat surfaces at the microscopic level. For instance, the substrate front surface 20 may comprise microstructures in the shape of pyramids or inverted pyramids which present flat facets. In the case of microstructured substrate, the layered interface is deposited on the textured surface, and the textured surface structure including nanowires is formed onto the flat surfaces of the layered interface. The combination of a surface texturation at the microscopic level and of nanowires at the nanometric level enables to further enhance light trapping inside the solar cell structure. The textured surface structure made of dielectric coated nanowires diffracts light into the semiconducting substrate and the microscopic level textured surface contributes to further enhance light trapping.

Method

A specific example of a solar cell manufacturing method is detailed below.

A monocrystalline silicon (c-Si) wafer is selected as a semiconducting substrate 1.

The semiconducting substrate 1 may be a double side polished substrate. Alternatively, the semiconducting substrate 1 may have a textured front surface having flat surfaces of microscopic size, for example shaped in pyramids or inverted-pyramids.

Generally, the substrate includes an electronic junction, of homojunction or heterojunction type, which is not described herein.

A. Cleaning of the Bare Substrate Surfaces

The surfaces 20, 30 of a c-Si wafer are cleaned for example in a wet etch process with a solution including 5% hydrofluoric acid (HF), for at least 30 seconds.

B. Forming a Layered Interface

A layered interface is formed on a surface 20 of the semiconducting substrate 1.

In a particular embodiment, this step B is performed in two-steps:

b1 Deposition of Passivation Layer(s)

At least one passivation layer 2 is deposited on the front side of the c-Si wafer. Preferably, a passivation layer 2 is deposited on the front side 20 and another passivation layer 12 2 is deposited on the back side 30 of the c-Si wafer 1. For example, passivation layers 2, 12 may be deposited by Plasma Enhanced Chemical Vapor Deposition (PECVD) in a plasma reactor, at low temperature, for example at 175° C. For illustrative purpose, a 20 nm thick passivation layer 2 of a-Si:H is deposited on the front side surface 20 and a 50 nm thick passivation layer 12 of a-Si:H is deposited on the back side surface 30.

b2 Deposition of a Dielectric Layer

The next step comprises deposition of a dielectric layer 3 on the front side, e.g. on the front side passivation layer 2. The material used for the dielectric layer 3 is for example amorphous hydrogenated silicon nitride (a-SiN$_x$:H) or silicon dioxide (SiO$_2$). The dielectric layer 3 may be deposited at room temperature in a plasma reactor or by atomic layer deposition (ALD). The thickness of the dielectric layer is determined from Spectroscopic Ellipsometry) measurements. This dielectric layer thickness is comprised between 20 nm and 200 nm.

In a variant, this step b2) of depositing a dielectric layer comprises deposition of a dielectric layer having a gradient index profile.

Alternatively, the steps b1) of depositing a passivation layer on a semiconducting substrate surface and b2) of depositing a dielectric layer on the passivation layer may be replaced by a step of depositing an interface layer, said interface layer being both a passivating material and an electrically insulating material, such as silicon dioxide (SiO$_2$).

In a variant, this step of forming a layered interface comprising an interface layer adapted for passivating the semiconducting substrate and for providing a surface which is electrically insulated from the semiconducting substrate, comprises deposition of an interface layer having a gradient index profile.

In still another variant, the step B. of forming a layered interface, further comprises deposition of one or more other transparent layers on the electrically insulating layer.

In any case, the layered interface has a first surface 21 in contact with the surface 20 of the semiconducting substrate and a second surface, which is the top surface of the layered interface, this second surface being electrically insulated from this first surface. In any case also, the layered interface provides surface passivation of the semiconducting substrate surface 20 whereon this layered interface is formed.

The following steps concern the formation of the textured surface structure on the layered interface, and more precisely on the second surface of the layered structure.

C. Formation of a Plurality of Nanowires

Preferably, the nanowires are grown using a VLS (Vapor-Liquid-Solid) process.

e) Deposition of an Ultra Thin Layer of Metal Catalyst

A very thin layer of a low-melting point metal catalyst is deposited on the second surface 23 of the layered interface. For example, in the first embodiment, illustrated in FIGS. 1 and 2, this thin layer of metal catalyst is deposited on the dielectric layer 3.

The metal catalyst may be deposited by evaporation or electron-beam evaporation at room temperature. Low-point metal catalyst may be selected from tin (Sn), indium (In) or bismuth (Bi).

As an option, this step of deposition an ultra-thin film of metal catalyst may be performed before or after a masking step, in order to allow deposition of the low-melting point metal catalyst only on some determined areas of the substrate. For example, a masking process may be used to generate a periodic pattern of metal catalyst on the second surface 23 of the layered interface, the mask being removed at a later step. In a preferred embodiment, a hexagonal mask with a center to center distance of 600 nm is used to grow silicon nanowires.

f) Formation of Metal Catalyst Droplets

The application of hydrogen plasma to the thin layer of low-melting point metal catalyst generates nanometric size metallic droplets on the second surface 32 of the layered interface. The hydrogen plasma conditions may be: flow rate of 100 sccm, pressure of 0.6 Torr, temperature above metal melting point temperature, for example of 250° C., radio-frequency power of 50 W, for a duration of 10 min.

g) Synthesis of Nanowires

A plasma enhanced vapor-liquid-solid (VLS) process may be used for synthesis of nanowires. The low-melting point catalyst allows reducing the temperature of nanowires growth process to 425° C. or below. For example silicon nanowires may be obtained in the following experimental conditions: a gas mixture of silane (SiH$_4$) as precursor gas and hydrogen (H$_2$) as carrier gas, with respective flow rates of 10 sccm of silane and 100 sccm of hydrogen, a total pressure of 1 Torr, at a temperature of 425° C., radio-frequency power of 2 W, for a duration of 2 min. Silicon nanowires 4 are thus grown from the liquid metal catalyst droplets.

As illustrated on FIG. 1, silicon nanowires 4 protrude from the second surface 23 of the layered interface.

The length and diameter of the silicon nanowires are in general comprised between 20 nm and 200 nm. The aspect ratio of the nanowires is selected between 1 and 100 and preferably below 10.

h) Removal of Metal Catalyst

The remaining metal catalyst is removed from the surface of the as grown nanowires. For example, the remaining metal catalyst droplets are removed by applying hydrogen plasma at a flow rate of 100 sccm, pressure of 0.6 Torr, temperature of 250° C., radio-frequency power of 5 W, for duration of 30 min.

D. Coating of the Nanowires by a Transparent Dielectric Coating

A transparent dielectric coating 5 is deposited on the nanowires 4. The material used for the dielectric coating 5 is for example amorphous hydrogenated silicon nitride (a-SiNx:H) or silicon dioxide ($SiO_2$). The transparent dielectric coating 5 may be deposited at room temperature in a plasma reactor or in ALD. The thickness of the dielectric coating 5 is comprised between 20 nanometers and 200 nanometers.

Thus, the textured surface structure comprising nanowires 4 and a transparent dielectric coating 5 is achieved. The nanowires are completely embedded between the second surface 23 of the layered interface and the dielectric coating 5.

The method of the invention enables to manufacture solar cells with improved conversion efficiency. In particular, this method enables to improve absorption in the visible spectrum without affecting the surface recombination.

As part of the present disclosure, the minority carrier lifetime has been measured in a solar cell comprising only a passivation layer 2 and for different solar cells with nanowires 4 on a layered interface with a passivation layer 2 and a dielectric layer 3, as illustrated in FIG. 1 without a dielectric coating 5. A reference solar cell comprising only the passivation layer(s) 2 and 12 has a minority carrier lifetime of 500 microseconds. FIG. 4 represents the minority carrier lifetime (L.T.) of different solar cells including a passivation layer and a dielectric layer covered with silicon nanowires as a function of the growth temperature (T in ° C.) of the silicon nanowires (step (f) above). The silicon nanowires are deposited by VLS in a plasma of hydrogen and silane for a duration of 2 min each. In the diagram represented on FIG. 4, each square represents one run of silicon nanowires growth.

Surprisingly, the minority carrier lifetime of these solar cells is comprised between 1000 and about 1700 microseconds which is much higher than the minority carrier lifetime of 500 μs for the as-passivated c-Si wafer without the silicon nanowires. Moreover, the minority carrier lifetime appears to increase with the silicon nanowires growth temperature. More precisely, the minority carrier lifetime increases from 1000 μs at 275° C. up to a maximum of about 1700 μs at 425° C., and then decrease at a temperature of 475° C.

It derives from these minority lifetime measurements, that these structures with a layered interface and uncoated nanowires provides enhanced front surface passivation, as compared to the reference solar cell comprising only the passivation layer(s) 2 and 12.

The absorption properties of a solar cell according to the present disclosure are evaluated by measuring the spectral absorptance $A(\lambda)$ as a function of the wavelength $\lambda$ in the spectral range from 350 nm to 1100 nm. The integrated short circuit current density $J_{sc}$ is calculated from the integration of total absorptance over the spectral range from 350 nm to 1100 nm using the formula:

$$J_{sc} = e \int A(\lambda) \cdot N(\lambda) \cdot d\lambda$$

where e represents the electron charges, $A(\lambda)$ the total absorptance, and $N(\lambda)$ the number of photons per unit area per second for the wavelength $\lambda$ from the standard solar spectrum.

Figure 5:
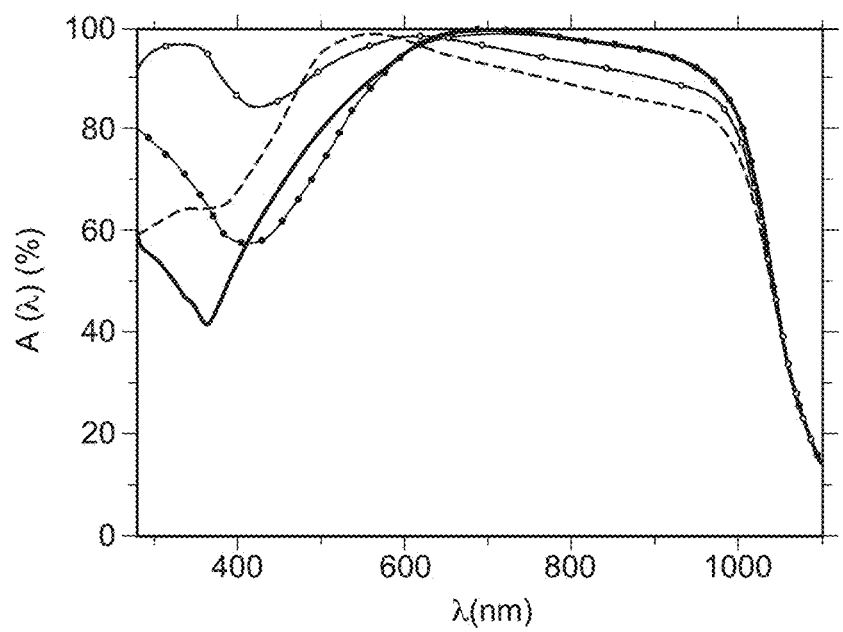
FIG. 5 represents measurements of absorption spectra of various solar cell structures respectively with a dielectric layer and without nanowires (plain line), with nanowires and without dielectric coating on the nanowires (dashed line), with nanowires and dielectric coating of different thicknesses on the nanowires (20 nm for black circles and respectively 50 nm for the white circles).

The plain line on FIG. 5 represents the measured total absorptance spectrum $A(\lambda)$ of a reference solar cell structure with a 100 nm thick $SiN_x$ dielectric layer on a passivation layer of 4 nanometers and without nanowires. The thickness of the $SiN_x$ dielectric layer is optimized to obtain an anti-reflective coating maximizing $J_{sc}$. The integrated short circuit current density $J_{sc}$ of this reference solar cell is 36.94 mA/cm².

The other curves on FIG. 5 represent absorptance measurements of different solar cells with a layered interface comprising passivating and insulating layer(s) 2, 3, and with a textured surface structure comprising nanowires 4 and a dielectric coating 5 according to the first embodiment of the present disclosure.

In order to embed the silicon nanowires 4, the thickness of the dielectric layer 3 which decouples the nanowires from the passivated c-Si substrate is reduced to 50 nm. Silicon nanowires of 200 nm length are grown on this 50 nm thick dielectric layer 3.

The dashed line on FIG. 5 represents the measured absorption spectrum $A(\lambda)$ of a solar cell structure with a layered interface consisting of a 50 nm thick $SiN_x$ dielectric layer 3 on a 4 nm thick passivation layer 2, with silicon nanowires 4 on the layered interface and without dielectric coating on the nanowires (as illustrated on FIG. 1). The integrated short circuit current density of this solar cell is 36.92 mA/cm².

The black circles-line on FIG. 5 represents the measured absorption spectrum $A(\lambda)$ of another solar cell structure with a layered interface consisting of a 50 nm thick $SiN_x$ dielectric layer 3 on a 4 nm thick passivation layer 2, and a textured surface structure on this layered interface, the textured surface structure consisting of silicon nanowires 4 and a 20 nm thick dielectric coating 5 on the silicon nanowires 4 (as illustrated on FIG. 2). The integrated short circuit current density $J_{sc}$ of this solar cell is 37.15 mA/cm². The thickness of the dielectric coating 5 is estimated from measurements of the thickness of a similar dielectric coating deposited on a flat surface in the same conditions.

The white circles-line on FIG. 5 represents the measured total absorptance spectrum $A(\lambda)$ of a solar cell structure with a layered interface consisting of a 50 nm thick $SiN_x$ dielectric layer on a 4 nm thick passivation layer 2, and a textured surface structure on this layered interface, the textured surface structure consisting of silicon nanowires 4 and a 50 nm thick dielectric coating 5 on the silicon nanowires 4 (as illustrated on FIG. 2). The integrated short circuit current density $J_{sc}$ of this solar cell is 38.90 mA/cm².

The difference between the black circles-line and the white circles-line on FIG. 5 is only the silicon nitride dielectric coating 5 thickness, which is respectively of 20 nm for the black circles-line and of 50 nm for the white circles-line.

The solar cells with a layered interface and a textured surface structure provide same or higher Jsc as compared to a reference solar cell with a layered interface but without the textured surface structure as disclosed herein.

It derives from the spectral absorptance curves of the different solar cells in FIG. 5, that compared to an optimized dielectric layer of 100 nm, the combination of dielectric coated silicon nanowires of adequate length on a layered interface results in increasing the absorption in the blue region of the solar spectrum without any loss in the near-infrared spectral region. The integrated short circuit current density of 38.90 mA/cm$^2$ is herein demonstrated. However, this value of 38.90 mA/cm$^2$ is well below maximum achievable $J_{sc}$ values using the method of the invention.

The textured surface structure with silicon nanowires provides light scattering, thus enabling light trapping into the solar cell.

A simulation enables to compute the $J_{sc}$ values for a semi-infinite c-Si wafer coated with a layered interface and with a textured surface structure on this layered interface. More precisely, the layered interface consists of an a-Si:H passivation layer 2 and a thin SiNx dielectric layer 3, and the textured surface structure consists of silicon nanowires 4 coated with a silicon nitride coating SiNx on top of it. For this simulation, silicon nitride coated nanowires with a diameter of 425 nm are ordered in a hexagonal arrangement with center to center distance of 600 nm. The value of the SiNx dielectric layer 3 thickness varies between 30 nm and 70 nm, and the value of the silicon nitride coated nanowires heights varies between 80 to 140 nm. A two dimension map of the short circuit current density $J_{sc}$ integrated over the spectral range 350 nm-1100 nm is obtained. It derives from this computation, that the $J_{sc}$ values are comprised between 40 mA/cm$^2$ up to 42 mA/cm$^2$. More precisely, a maximum $J_{sc}$ value of 42 mA/cm$^2$ is achieved for silicon-nitride nanowires having a length or height of 105 nm, and a silicon nitride dielectric layer thickness of 50 nm.

This demonstrates that it is possible to achieve high $J_{sc}$ values of 42 mA/cm$^2$. Moreover, the spreading of the $J_{sc}$ values is limited to less than 2.1 mA/cm$^2$ (between ~40 mA/cm$^2$ up to 42 mA/cm$^2$) over the investigated range of dielectric layer thicknesses and SiNx nanowire heights, which outlines the robustness of this approach.

The increase of the integrated $J_{sc}$ value of a solar cell structure with a textured surface structure on this layered interface, as compared to a solar cell comprising only a layered interface without nanowires, means that light trapping inside the solar cell is increased due to the presence of nanowires.

Thus, the present disclosure enables the manufacture of solar cells presenting both enhanced lifetime and increased total absorption, especially in the blue region of the spectrum.

As a result, the conversion efficiency of the solar cell is increased.

It derives from the present disclosure that the layered interface comprising a thin dielectric layer 3 provides an efficient electrical insulation or decoupling between the passivated c-Si substrate and the nanowires.

Thus the invention combines advantageously the optical surface properties of low reflectivity due to the dielectric coated nanowires and the electrical surface passivation properties due to the surface passivation of the semiconducting substrate by the layered interface.

The method of the invention requires only a few more steps in a conventional fabrication process.

This method may be implemented in the fabrication of front-back solar cell structures as well as on all-back contact structures, such as Interdigitated back contact (IBC) solar cell structures. The electrical contacts of the solar cell may be formed by deposition of conducting plugs or layer.

The present invention applies in particular to optoelectronic devices such as photovoltaic solar cells.

The present disclosure also applies to other optoelectronic devices such as photodiodes or light detectors. The dielectric layers embedding nanowires on the front surface enable to increase coupling incident light into the optoelectronic device without increasing surface recombination of charge carriers inside the optoelectronic device.

The invention claimed is:

1. An optoelectronic device comprising:
a semiconducting substrate having a surface;
a layered interface structure, said layered interface structure having a first surface in contact with said surface of said semiconducting substrate and said layered interface structure being configured to passivate said surface of said semiconducting substrate, said layered interface structure having a second surface and said layered interface structure being configured to electrically insulate said first surface from said second surface; and
a textured surface structure comprising a plurality of nanowires and a transparent dielectric coating, said textured surface structure being in contact with said second surface of said layered interface structure, said plurality of nanowires protruding from said second surface and said plurality of nanowires being fully embedded between said second surface and said transparent dielectric coating, said plurality of nanowires coated by said transparent dielectric coating having a height comprised between 20 nanometers and 200 nanometers.

2. The optoelectronic device according to claim 1, wherein said layered interface structure comprises a passivating layer and a transparent dielectric layer, said first surface of said layered interface structure being a surface of said passivating layer, said second surface of said layered interface structure being a surface of said transparent dielectric layer, said passivating layer being in contact with another surface of said transparent dielectric layer, and said transparent dielectric layer being separated from said surface of said semiconducting substrate.

3. The optoelectronic device according to claim 2, wherein said passivating layer comprises a layer of amorphous hydrogenated silicon and said transparent dielectric layer comprises a layer of silicon nitride, silicon oxide or aluminum oxide.

4. The optoelectronic device according to claim 2, wherein respectively said passivating layer, said transparent dielectric layer, and/or said transparent dielectric coating have thicknesses comprised between 2 nanometers and 300 nanometers.

5. The optoelectronic device according to claim 2, wherein said layered interface structure and said transparent dielectric coating have respective thicknesses and refractive indices chosen so that said layered interface structure, said plurality of nanowires and said transparent dielectric coating collectively form an anti-reflection coating.

6. The optoelectronic device according to claim 2, wherein said surface of said semiconducting substrate is flat over an area of at least micrometric dimensions of the semiconducting substrate and/or comprises a microstructurally textured surface.

7. The optoelectronic device according to claim 2, wherein said plurality of nanowires comprises a plurality of silicon or zinc-oxide nanowires, and said plurality of nanowires coated by said transparent dielectric coating have a diameter comprised between 20 nanometers and 50 nanometers, a density comprised between 107 cm$^{-2}$ and 109 cm$^{-2}$ and/or an aspect ratio comprised between 1 and 100.

8. The optoelectronic device according to claim 1, wherein said layered interface structure comprises a single passivating and electrically insulating layer.

9. The optoelectronic device according to claim 8, wherein said single passivating and electrically insulating layer comprises a layer of silicon nitride, silicon oxide or aluminum oxide.

10. The optoelectronic device according to claim 1, wherein said layered interface structure and said transparent dielectric coating have respective thicknesses and refractive indices chosen so that said layered interface structure, said plurality of nanowires and said transparent dielectric coating collectively form an anti-reflection coating.

11. The optoelectronic device according to claim 1, wherein said surface of said semiconducting substrate is flat over an area of at least micrometric dimensions of the semiconducting substrate.

12. The optoelectronic device according to claim 1, wherein said surface of said semiconducting substrate comprises a microstructurally textured surface.

13. The optoelectronic device according to claim 1, wherein said plurality of nanowires has a random or periodic spatial distribution on said second surface of said layered interface structure.

14. The optoelectronic device according to claim 1, wherein said semiconducting substrate comprises a monocrystalline silicon substrate or microcrystalline silicon substrate or polycrystalline silicon substrate.

15. The optoelectronic device according to claim 1, wherein said plurality of nanowires comprises a plurality of silicon or zinc-oxide nanowires, and said plurality of nanowires in contact with said transparent dielectric coating have a diameter comprised between 20 nanometers and 50 nanometers, a density comprised between 107 cm$^{-2}$ and 109 cm$^{-2}$ and/or an aspect ratio comprised between 1 and 100.

16. A method of fabricating an optoelectronic device, the method comprising:
    providing a semiconducting substrate having a surface;
    forming a layered interface structure, said layered interface structure having a first surface in contact with said surface of said semiconducting substrate and said layered interface structure being configured to passivate said surface of said semiconducting substrate, said layered interface structure having a second surface and said layered interface structure being configured to electrically insulate said first surface from said second surface;
    forming a plurality of nanowires protruding from said second surface of said layered interface structure, said plurality of nanowires having a height comprised between 20 nanometers and 200 nanometers; and
    forming a transparent dielectric coating, having a thickness comprised between 20 nanometers and 200 nanometers, on the plurality of nanowires, the plurality of nanowires and the transparent dielectric coating forming a textured surface structure in contact with the second surface of the layered interface structure, so that said plurality of nanowires are fully embedded between said second surface of said layered interface structure and said transparent dielectric coating, so that said plurality of nanowires coated by said transparent dielectric coating having a height comprised between 20 nanometers and 200 nanometers.

17. The method of fabricating the optoelectronic device according to claim 16, wherein the forming the plurality of nanowires comprises:
    evaporating a thin layer of a metal catalyst on said second surface of said layered interface structure,
    exposing the thin layer of metal catalyst to a hydrogen plasma for forming metal catalyst droplets,
    growing the plurality of nanowires from the metal catalyst droplets using a vapor-liquid-solid process, and
    removing the metal catalyst droplets.

18. The method of fabricating the optoelectronic device according to claim 16, wherein the forming the layered interface structure comprises:
    forming a passivating layer on said surface of the semiconducting substrate to passivate said surface of said semiconducting substrate; and
    forming a transparent dielectric layer on said passivating layer, said transparent dielectric layer being in contact with said passivating layer and said transparent dielectric layer being separated from said surface of said semiconducting substrate.

19. The optoelectronic device according to claim 8, wherein said surface of said semiconducting substrate is flat over an area of at least micrometric dimensions of the semiconducting substrate and/or comprises a microstructurally textured surface.

* * * * *